US012609680B2

(12) United States Patent
Chen et al.

(10) Patent No.: US 12,609,680 B2
(45) Date of Patent: Apr. 21, 2026

(54) POSITIVE HYSTERESIS ELIMINATION COMPARISON CIRCUIT AND MOTOR DRIVER HAVING POSITIVE HYSTERESIS ELIMINATION COMPARISON CIRCUIT

(71) Applicant: ANPEC ELECTRONICS CORPORATION, Hsinchu (TW)

(72) Inventors: Chun-Cheng Chen, Hsinchu (TW); Ming-Jung Tsai, Changhua City (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 43 days.

(21) Appl. No.: 18/752,816

(22) Filed: Jun. 25, 2024

(65) Prior Publication Data

US 2025/0274108 A1      Aug. 28, 2025

(30) Foreign Application Priority Data

Feb. 23, 2024     (TW) ................................. 113106461

(51) Int. Cl.
| *H03K 3/00* | (2006.01) |
| *H03K 3/0233* | (2006.01) |
| *H03K 5/08* | (2006.01) |
| *H03K 5/1252* | (2006.01) |

(52) U.S. Cl.
CPC ........... *H03K 3/02337* (2013.01); *H03K 5/08* (2013.01); *H03K 5/1252* (2013.01)

(58) Field of Classification Search
CPC ..... H03K 3/02337; H03K 5/08; H03K 5/1252
See application file for complete search history.

(56) References Cited

U.S. PATENT DOCUMENTS

| | | | | |
|---|---|---|---|---|
| 5,530,333 | A * | 6/1996 | Turner ..................... | H02P 25/08 |
| | | | | 318/400.13 |
| 5,691,856 | A * | 11/1997 | Kardash ............... | G11B 19/247 |
| | | | | 360/73.03 |
| 5,949,597 | A * | 9/1999 | Pahr .................. | G11B 20/10009 |
| | | | | 360/65 |
| 7,292,083 | B1 * | 11/2007 | Wang ................... | H03K 5/2472 |
| | | | | 327/66 |
| 7,382,167 | B1 * | 6/2008 | Umminger ............. | H03K 5/088 |
| | | | | 327/78 |
| 9,000,703 | B2 * | 4/2015 | Chew ...................... | H02P 6/182 |
| | | | | 318/400.34 |
| 10,985,706 | B1 * | 4/2021 | Li ........................ | H03F 3/45233 |
| 2023/0058267 | A1 * | 2/2023 | Tzeng ....................... | H02P 6/22 |

* cited by examiner

*Primary Examiner* — Tuan T Lam

(74) *Attorney, Agent, or Firm* — Li & Cai Intellectual Property Office

(57) ABSTRACT

A positive hysteresis elimination comparison circuit and a motor driver having a positive hysteresis elimination comparison circuit are provided. The motor driver includes a comparator and a hysteresis switching circuit. The comparator compares a voltage of a first voltage signal received by a first input terminal of the comparator with a voltage of a second voltage signal received by a second input terminal of the comparator to output a comparing signal within a comparison time. When the voltage of the first voltage signal is lower than the voltage of the second voltage signal, the comparison time is delayed. When the voltage of the first voltage signal is higher than the voltage of the second voltage signal and a positive hysteresis elimination signal is received by a first control terminal of the comparator, the comparison time is not delayed.

19 Claims, 9 Drawing Sheets

FIG. 9

POSITIVE HYSTERESIS ELIMINATION COMPARISON CIRCUIT AND MOTOR DRIVER HAVING POSITIVE HYSTERESIS ELIMINATION COMPARISON CIRCUIT

CROSS-REFERENCE TO RELATED PATENT APPLICATION

This application claims the benefit of priority to Taiwan Patent Application No. 113106461, filed on Feb. 23, 2024. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a comparison circuit, and more particularly to a positive hysteresis elimination comparison circuit and a motor driver having a positive hysteresis elimination comparison circuit.

BACKGROUND OF THE DISCLOSURE

In electronic equipment, fans are often used to cool heat-generating components such as processors. In the process of cooling the heating element by the fan, the operation of the fan motor needs to be accurately controlled, so that the fan can exhibit the most appropriate cooling performance and properly cool the heating element.

After receiving the voltage signal, the first and second input terminals of the comparator of the conventional motor driver compare the voltage of the voltage signal of the first input terminal of the comparator with the voltage of the voltage signal of the second input terminal of the comparator, and the comparison time is delayed to avoid glitches in the output signal of conventional motor drivers which may cause malfunctions. However, the delay in the comparison time of the comparator will result in the inability to accurately determine the motor's operating position (that is, the zero-crossing point). The determined zero-crossing point will appear later than the actual zero-crossing point, resulting in the inability to accurately determine the motor's operating position at the correct time, such that the motor cannot be driven immediately at the correct time, and the driving efficiency of the conventional motor drivers is poor.

SUMMARY OF THE DISCLOSURE

In response to the above-referenced technical inadequacies, the present disclosure provides a comparison circuit with positive hysteresis elimination. The positive hysteresis elimination comparison circuit of the present disclosure includes a comparator and a hysteresis switching circuit. The comparator is configured to compare the voltage of the first voltage signal received by the first input terminal of the comparator with the voltage of the second voltage signal received by the second input terminal of the comparator within a comparison time to output a comparison signal. The hysteresis switching circuit is connected to the first control terminal of the comparator. The hysteresis switching circuit is configured to output a positive hysteresis elimination signal to the first control terminal of the comparator. When the voltage of the first voltage signal is lower than the voltage of the second voltage signal, the comparison time is delayed by a negative hysteresis time. When the voltage of the first voltage signal is higher than the voltage of the second voltage signal and the first control terminal of the comparator receives the positive hysteresis elimination signal from the hysteresis switching circuit, the comparison time is not delayed by a positive hysteresis time.

In addition, the present disclosure provides a motor driver having a positive hysteresis elimination comparison circuit. The motor driver of the present disclosure is suitable for three-phase motors. The first terminal of the first coil of the first phase of the three-phase motor, the first terminal of the second coil of the second phase of the three-phase motor, and the first terminal of the third coil of the third phase of the three-phase motor are connected to the common contact point. The motor driver having a positive hysteresis elimination comparison circuit of the present disclosure includes a positive hysteresis elimination comparison circuit, a signal generation circuit and a driver circuit. The positive hysteresis elimination comparison circuit includes a comparator and a hysteresis switching circuit. The first input terminal of the comparator receives a signal from one of the second terminal of the first coil, the second terminal of the second coil and the second terminal of the third coil of the three-phase motor as the first voltage signal. The second input terminal of the comparator receives the signal from the common contact point as a second voltage signal. The comparator compares the voltage of the first voltage signal with the voltage of the second voltage signal within a comparison time to output a comparison signal. The hysteresis switching circuit is connected to the first control terminal of the comparator. The hysteresis switching circuit is configured to output a positive hysteresis elimination signal to the first control terminal of the comparator. The signal generation circuit is connected to the output terminal of the comparator. The signal generation circuit is configured to output a waveform signal according to the comparison signal received from the output terminal of the comparator. The driver circuit is connected to the signal generation circuit and the second terminal of the first coil, the second terminal of the second coil and the second terminal of the third coil of the three-phase motor. The driver circuit is configured to drive the three-phase motor according to the waveform signal received from the signal generation circuit. When the voltage of the first voltage signal is lower than the voltage of the second voltage signal, the comparison time is delayed by a negative hysteresis time. When the voltage of the first voltage signal is higher than the voltage of the second voltage signal and the first control terminal of the comparator receives the positive hysteresis elimination signal from the hysteresis switching circuit, the comparison time is not delayed by a positive hysteresis time.

As described above, the present disclosure provides a positive hysteresis elimination comparison circuit and a motor driver having the same. The positive hysteresis elimination comparison circuit of the present disclosure can accurately determine the time point when the voltage of the first voltage signal at the first input terminal of the comparator is equal to the voltage of the second voltage signal of the comparator (that is, the zero-crossing point). When the positive hysteresis elimination comparison circuit of the motor driver is used to drive the motor, the motor can be efficiently driven according to the precise zero-crossing point.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 9 is a graph showing that the motor driver having the positive hysteresis elimination comparison circuit according to the eighth embodiment of the present disclosure performs positive hysteresis and negative hysteresis before starting the three-phase motor and only performs negative hysteresis after the motor starts.

DETAILED DESCRIPTION OF THE EXEMPLARY EMBODIMENTS

Figure 1:
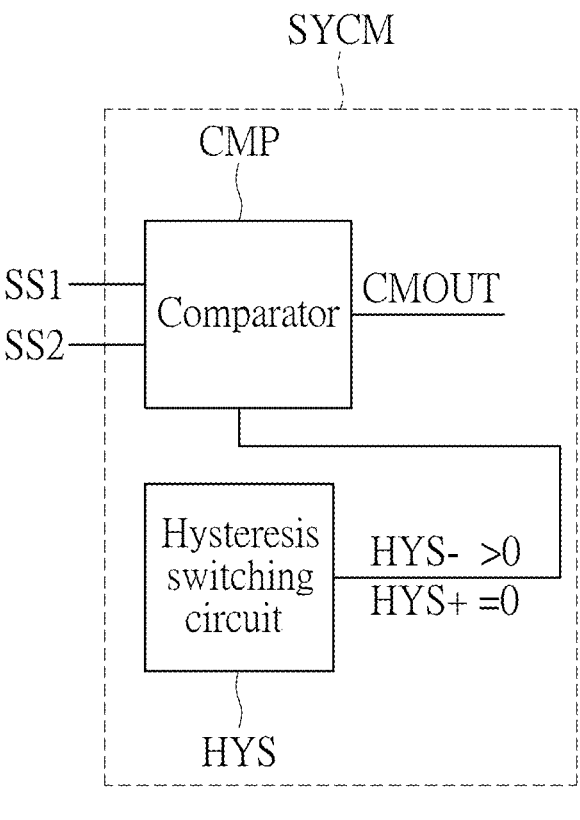
FIG. 1 is a block diagram of a positive hysteresis elimination comparison circuit according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether or not a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Reference is made to FIG. 1. FIG. 1 is a block diagram of a positive hysteresis elimination comparison circuit according to a first embodiment of the present disclosure.

As shown in FIG. 1, a positive hysteresis elimination comparison circuit SYCM of the present disclosure includes a comparator CMP and a hysteresis switching circuit HYS.

The comparator CMP compares the voltage of the first voltage signal SS1 received by the first input terminal of the comparator CMP with the voltage of the second voltage signal SS2 received by the second input terminal of the comparator CMP within a comparison time, so as to output a comparison signal CMOUT.

The hysteresis switching circuit HYS is connected to the first control terminal of the comparator CMP. The hysteresis switching circuit HYS outputs a positive hysteresis elimination signal to the first control terminal of the comparator CMP.

When the voltage of the first voltage signal SS1 is lower than the voltage of the second voltage signal SS2 (and the first control terminal of the comparator CMP receives a negative hysteresis trigger signal from the hysteresis switching circuit HYS), the comparator CMP delays a comparison time for comparing the voltage of the first voltage signal SS1 with the voltage of the second voltage signal SS2 by a negative hysteresis time. The negative hysteresis time is the time for the comparator CMP to perform a negative hysteresis (HYS–>0) operation, and the length of this time depends on the actual application.

It is worth noting that when the voltage of the first voltage signal SS1 is higher than the voltage of the second voltage signal SS2 and the first control terminal of the comparator CMP receives a positive hysteresis elimination signal from the hysteresis switching circuit HYS, the comparator CMP compares the voltage of the first voltage signal SS1 with the voltage of the second voltage signal SS2 without delaying a comparison time by a positive hysteresis time (HYS+=0). The positive hysteresis time is the time when comparator CMP performs positive hysteresis (HYS+>0).

The positive hysteresis elimination comparison circuit SYCM of the present disclosure only has negative hysteresis (HYS–>0) but no positive hysteresis (HYS+=0), so that a time point (that is, a zero-crossing point) when the voltage of the first voltage signal SS1 is equal to the voltage of the second voltage signal SS2 can be accurately compared through the comparator CMP.

Figure 2:
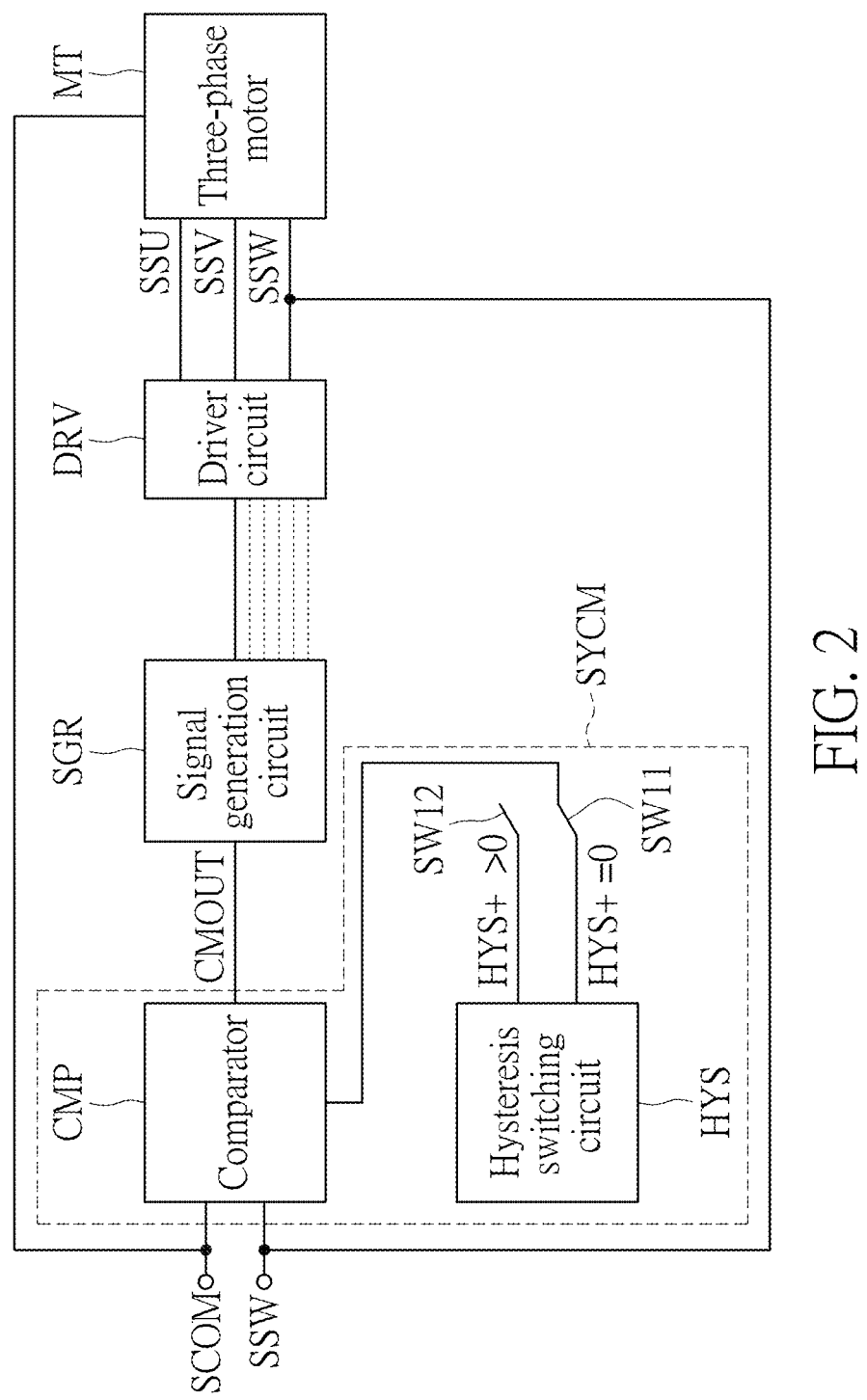
FIG. 2 is a block diagram of a motor driver having a positive hysteresis elimination comparison circuit according to a second embodiment of the present disclosure.
Figure 3:
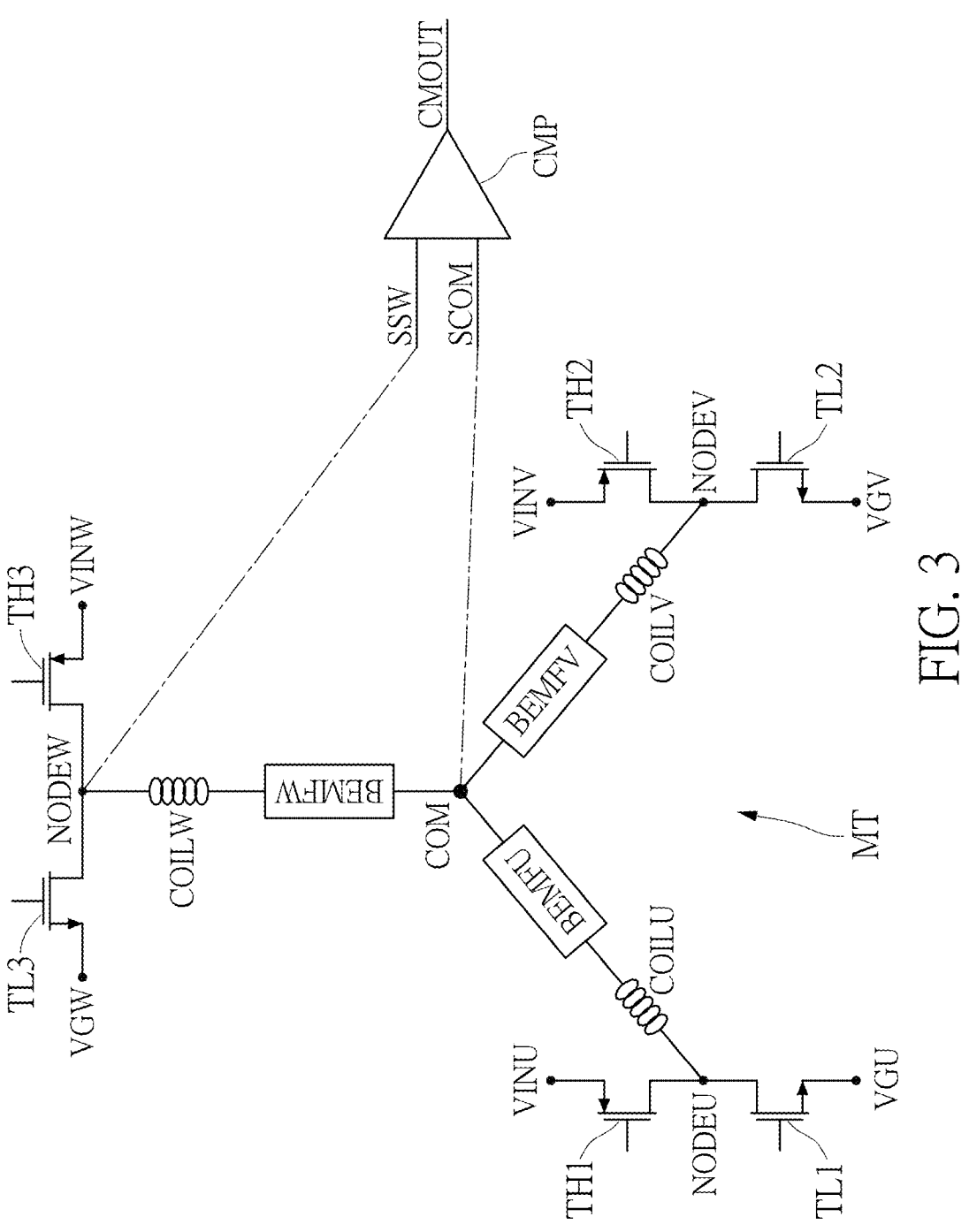
FIG. 3 is a circuit diagram of a driver circuit and a comparator of a motor driver having a positive hysteresis elimination comparison circuit and a three-phase motor according to the second embodiment of the present disclosure.
Figure 8:
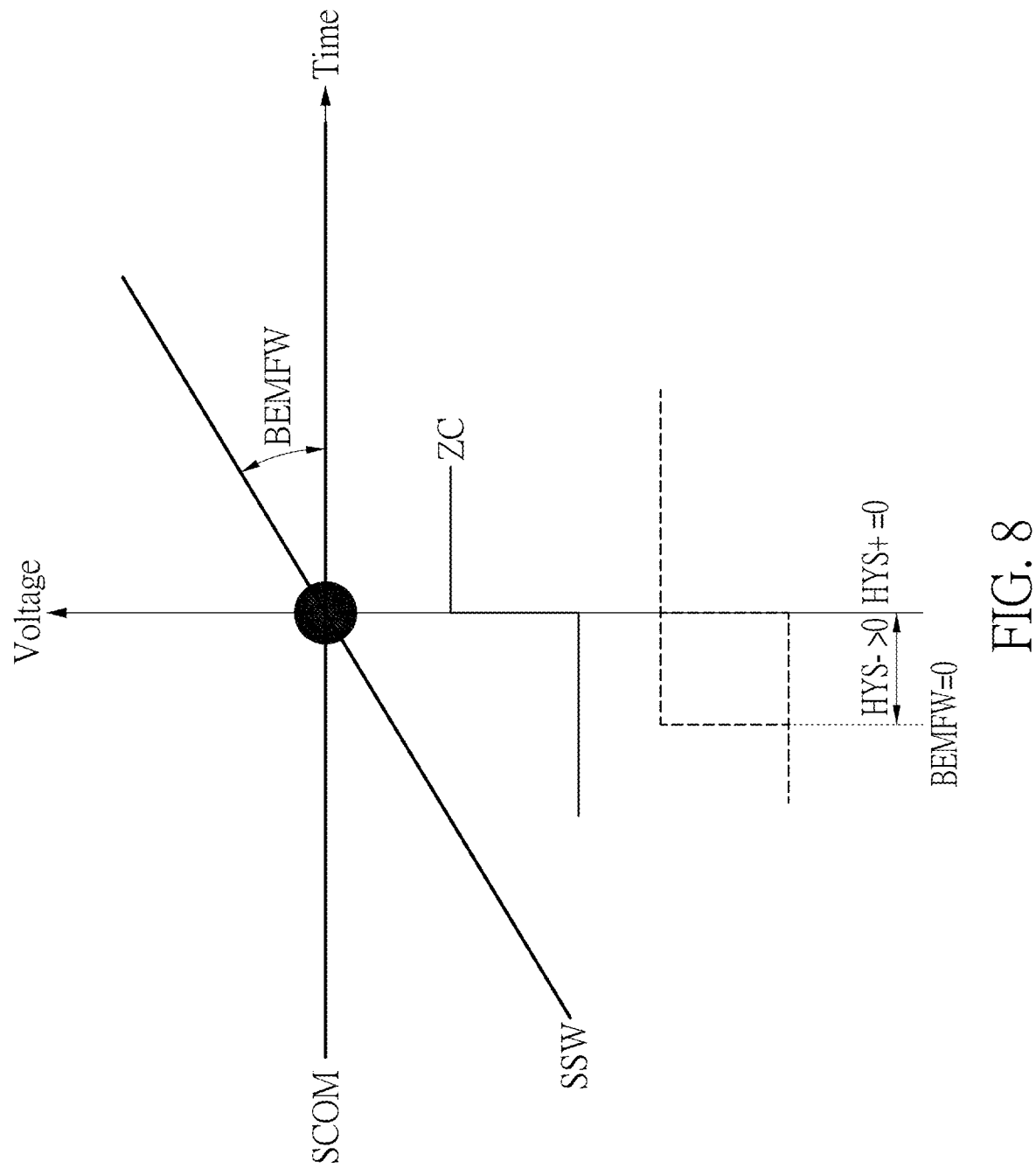
FIG. 8 is a graph showing that the motor driver having the positive hysteresis elimination comparison circuit of the first to sixth embodiments of the present disclosure executes negative hysteresis and does not execute positive hysteresis.

Reference is made to FIGS. 2, 3 and 8. FIG. 2 is a block diagram of a motor driver having a positive hysteresis elimination comparison circuit according to a second embodiment of the present disclosure, FIG. 3 is a circuit diagram of a driver circuit and a comparator of a motor driver having a positive hysteresis elimination comparison circuit and a three-phase motor according to the second embodiment of the present disclosure, and FIG. 8 is a graph showing that the motor driver having the positive hysteresis elimination comparison circuit of the first to sixth embodiments of the present disclosure executes negative hysteresis and does not execute positive hysteresis.

In the second embodiment, the motor driver of the present disclosure is suitable for a three-phase motor MT. As shown in FIG. 2, the motor driver of the present disclosure includes a positive hysteresis elimination comparison circuit SYCM, a signal generation circuit SGR and a driver circuit DRV.

The positive hysteresis elimination comparison circuit SYCM includes a comparator CMP and a hysteresis switching circuit HYS. If necessary, the positive hysteresis elimination comparison circuit SYCM may further include a first switching element SW11 and a second switching element SW12.

As shown in FIG. 3, the driver circuit DRV may include a first high-side switch TH1, a first low-side switch TL1, a second high-side switch TH2, a second low-side switch TL2, a third high-side switch TH3, and a third low-side switch. Switch TL3.

The first terminal of the first high-side switch TH1 is coupled to the first input voltage VINU. The second terminal of the first high-side switch TH1 is connected to the first terminal of the first low-side switch TL1. The second terminal of the first low-side switch TL1 is coupled to the first reference potential VGU. The node NODEU between the second terminal of the first high-side switch TH1 and the first terminal of the first low-side switch TL1 is connected to the second terminal of the first coil COILU of the first phase (for example, U phase) of the three-phase motor MT.

The first terminal of the second high-side switch TH2 is coupled to the second input voltage VINV. The second terminal of the second high-side switch TH2 is connected to the first terminal of the second low-side switch TL2. The second terminal of the second low-side switch TL2 is coupled to the second reference potential VGV. The node NODEV between the second terminal of the second high-side switch TH2 and the first terminal of the second low-side switch TL2 is connected to the second terminal of the second coil COILV of the second phase (for example, V phase) of the three-phase motor MT.

The first terminal of the third high-side switch TH3 is coupled to the third input voltage VINW. The second terminal of the third high-side switch TH3 is connected to the first terminal of the third low-side switch TL3. The second terminal of the third low-side switch TL3 is coupled to the third reference potential VGW. The node NODEW between the second terminal of the third high-side switch TH3 and the first terminal of the third low-side switch TL3 is connected to the second terminal of the third coil COILW of the third phase (for example, W phase) of the three-phase motor MT.

The first terminal of the first coil COILU of the first phase (for example, U phase) of the three-phase motor MT, the first terminal of the second coil COILV of the second phase (for example, V phase) of the three-phase motor MT, and the first terminal of the third coil COILW of the third phase (for example, W phase) of the three-phase motor MT are connected to a common contact point COM.

The first input terminal of the comparator CMP receives a signal from one of the second terminal of the first coil COILU of the first phase (for example, U phase) of the three-phase motor MT, the second coil COILV of the second phase (for example, V phase) of the three-phase motor MT and the second terminal of the third coil COILW of the third phase (for example, W phase) of the three-phase motor MT as the first voltage signal SSW.

The second input terminal of the comparator CMP receives the signal of the common contact point COM of the first terminal of the first coil COILU of the first phase (for example, U phase) of the three-phase motor MT, the first terminal of the second coil COILV of the second phase (for example, V phase) of the three-phase motor MT and the first terminal of the third coil COILW of the third phase (for example, W phase) of the three-phase motor MT as the second voltage signal SCOM.

The first output terminal of the hysteresis switching circuit HYS is connected to the first terminal of the first switching element SW11 and the first terminal of the second switching element SW12. The second terminal of the first switching element SW11 and the second terminal of the second switching element SW12 are selectively connected to the first control terminal of the comparator CMP. The output terminal of the comparator CMP is connected to the input terminal of the signal generation circuit SGR.

The output terminal of the signal generation circuit SGR is connected to the input terminal of the driver circuit DRV. Specifically, the output terminal of the signal generation circuit SGR is connected to the control terminal of the first high-side switch TH1, the control terminal of the first low-side switch TL1, the control terminal of the second high-side switch TH2, the control terminal of the second low-side switch TL2, the control terminal of the third high-side switch TH3, and the control terminal of the third low-side switch TL3 of the driver circuit DRV.

The comparator CMP compares the voltage of the first voltage signal SSW with the voltage of the second voltage signal SCOM within a comparison time to output a comparison signal CMOUT.

When the voltage of the first voltage signal SSW is lower than the voltage of the second voltage signal SCOM, the comparator CMP delays a comparison time between the voltage of the first voltage signal SSW and the voltage of the second voltage signal SCOM by a negative hysteresis time, as shown in FIG. 8, HYS−>0.

When the voltage of the first voltage signal SSW is higher than the voltage of the second voltage signal SCOM and the first control terminal of the comparator CMP receives a positive hysteresis elimination signal from the hysteresis switching circuit HYS through the first switching element SW11, the comparator CMP compares the voltage of the first voltage signal SSW with the voltage of the second voltage signal SCOM without delaying a positive hysteresis time, as shown in FIG. 8, HYS+=0.

The signal generation circuit SGR outputs one or more waveform signals to the control terminal of the first high-side switch TH1, the control terminal of the first low-side switch TL1, the control terminal of the second high-side switch TH2, the control terminal of the second low-side switch TL2, the control terminal of the third high-side switch TH3 and the control terminal of the third low-side switch TL3 of the driver circuit DRV.

The driver circuit DRV drives the three-phase motor MT to operate according to one or more waveform signals received from the signal generation circuit SGR.

As shown in FIG. 8, the comparator CMP of the positive hysteresis elimination comparison circuit SYCM of the present disclosure only has negative hysteresis (HYS−>0) but no positive hysteresis (HYS+=0), so that the comparator CMP can accurately compare a time point when the voltage of the first voltage signal SSW is equal to the voltage of the second voltage signal SCOM, that is, the time point when a back electromotive force signal BEMFW of the W-phase third coil COILW of the three-phase motor MT reaches a zero voltage value (that is, a zero-crossing point).

Figure 4:
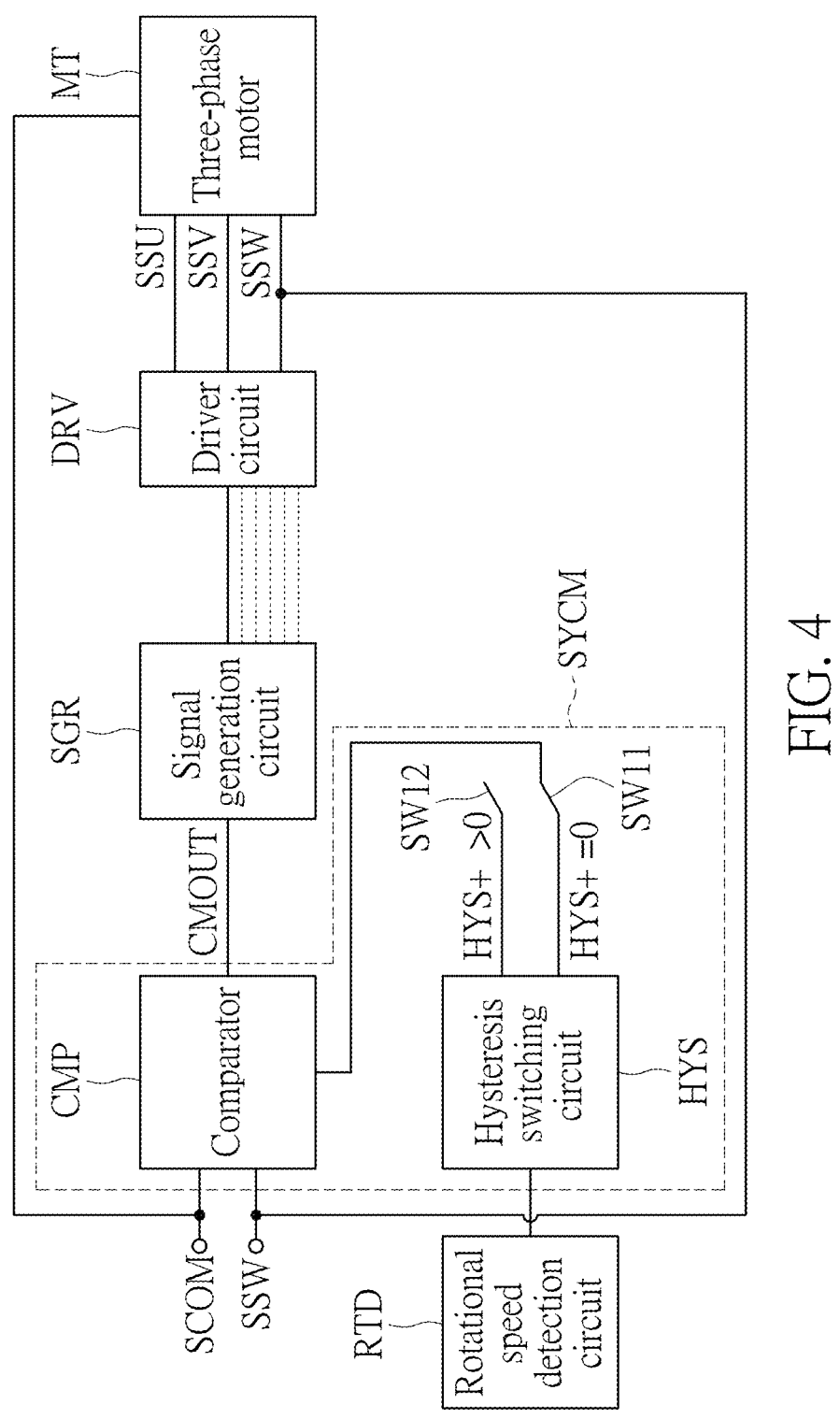
FIG. 4 is a block diagram of a motor driver having a positive hysteresis elimination comparison circuit according to a third embodiment of the present disclosure.
Figure 9:
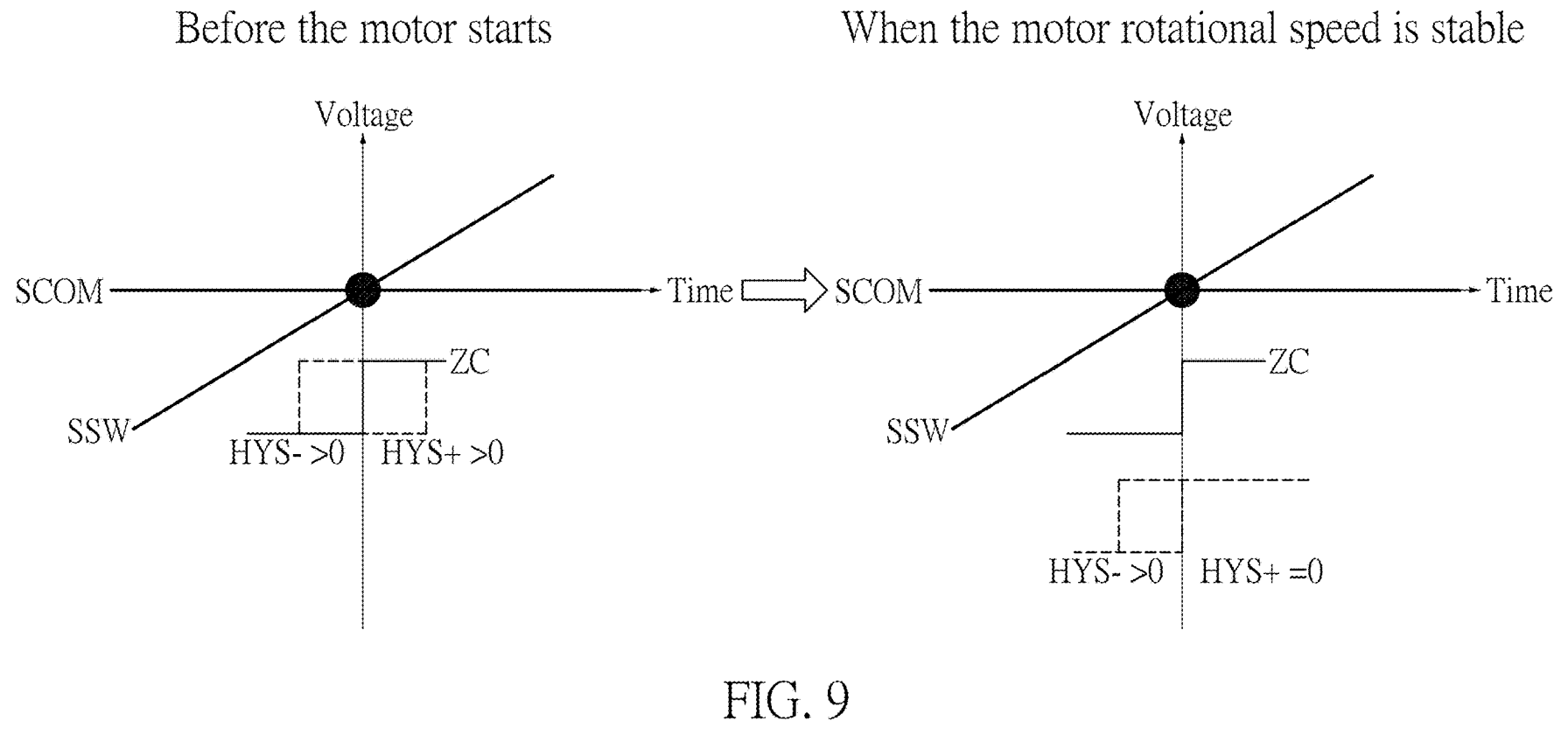

Reference is made to FIGS. 4 and 9. FIG. 4 is a block diagram of a motor driver having a positive hysteresis elimination comparison circuit according to a third embodiment of the present disclosure and FIG. 9 is a graph showing that the motor driver having the positive hysteresis elimination comparison circuit according to the eighth embodiment of the present disclosure performs positive hysteresis and negative hysteresis before starting the three-phase motor and only performs negative hysteresis after the motor starts.

In the third embodiment, the motor driver of the present disclosure is suitable for a three-phase motor MT as shown in FIG. 2. In addition to including a positive hysteresis elimination comparison circuit SYCM, a signal generation circuit SGR and a driver circuit DRV, a rotational speed detection circuit RTD is further included.

The similarities between the third embodiment of the present disclosure and the second embodiment of the present disclosure will not be described again below.

The rotational speed detection circuit RTD can be set in the three-phase motor MT and connected to the hysteresis switching circuit HYS. The rotational speed detection circuit RTD detects the rotational speed of the three-phase motor MT to output a motor rotational speed detection signal to the hysteresis switching circuit HYS.

When the hysteresis switching circuit HYS determines that the three-phase motor MT has not started or is not running stably according to a motor rotational speed detection signal received from the rotational speed detection circuit RTD, the second terminal of the second switching element SW12 is switched to the first control terminal connected to the comparator CMP. Under the circumstances, the hysteresis switching circuit HYS outputs a positive hysteresis trigger signal (as shown in FIG. 9, HYS+>0) to the first control terminal of the comparator CMP through the second switching element SW12, so that the comparator CMP delays a comparison time for comparing the voltage of the first voltage signal SSW with the voltage of the second voltage signal SCOM by a positive hysteresis time. At this time, the comparator CMP delays a comparison time for comparing the voltage of the first voltage signal SSW with the voltage of the second voltage signal SCOM by a negative hysteresis time, as shown in FIG. 9, HYS–>0.

Then, when the hysteresis switching circuit HYS determines that the three-phase motor MT is operating stably (that is, the speed of the three-phase motor MT is maintained at a constant value for a period of time) according to the motor rotational speed detection signal received from the rotational speed detection circuit RTD, the second terminal of the first switching element SW11 is switched to the first control terminal connected to the comparator CMP. Under these circumstances, the hysteresis switching circuit HYS outputs a positive hysteresis elimination signal (as shown in FIG. 9, HYS+=0) to the first control terminal of the comparator CMP through the first switching element SW11, so that a comparison time in which the comparator CMP compares the voltage of the first voltage signal SSW and the voltage of the second voltage signal SCOM is not delayed by a positive hysteresis time. At this time, the comparator CMP delays a comparison time for comparing the voltage of the first voltage signal SSW with the voltage of the second voltage signal SCOM by a negative hysteresis time, as shown in FIG. 9, HYS–>0.

Figure 5:
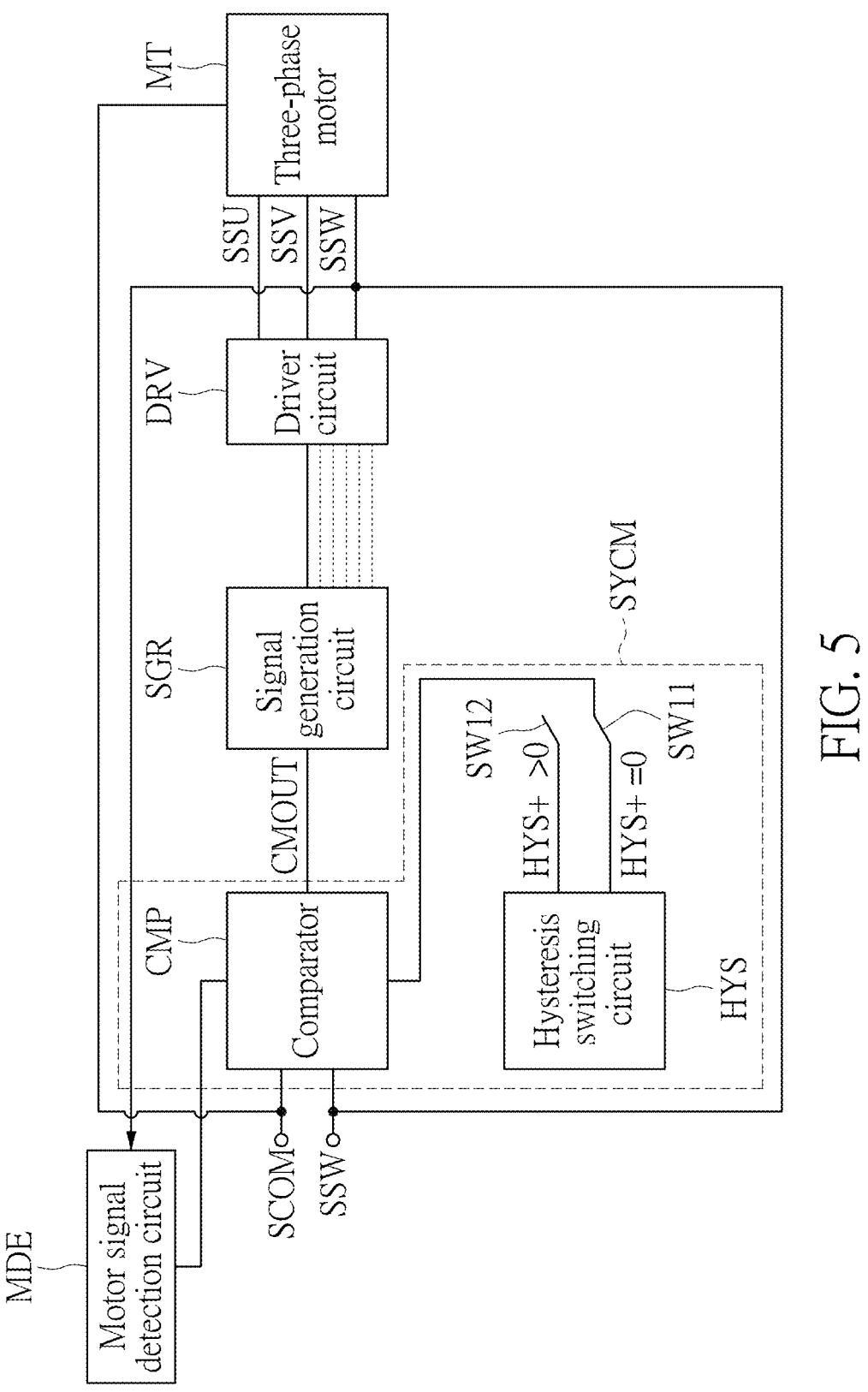
FIG. 5 is a block diagram of a motor driver having a positive hysteresis elimination comparison circuit according to a fourth embodiment of the present disclosure.

Reference is made to FIG. 5. FIG. 5 is a block diagram of a motor driver having a positive hysteresis elimination comparison circuit according to a fourth embodiment of the present disclosure.

In the fourth embodiment, the motor driver of the present disclosure is suitable for a three-phase motor MT as shown in FIG. 2. In addition to including a positive hysteresis elimination comparison circuit SYCM, a signal generation circuit SGR, a driver circuit DRV and a rotational speed detection circuit RTD, a motor signal detection circuit MDE is further included.

The similarities between the fourth embodiment of the present disclosure and the second embodiment of the present disclosure will not be described again below.

The motor signal detection circuit MDE is connected to the second control terminal of the comparator CMP. The motor signal detection circuit MDE is connected to one of the second terminal of the first coil COILU of the first phase (for example, U phase) of the three-phase motor MT and the second terminal of the second coil COILV of the second phase (for example, V phase) of the three-phase motor MT and the second terminal of the third coil COILW of the third phase (for example, W phase) of the three-phase motor MT.

The motor signal detection circuit MDE detects the voltage signal from one of the second terminal of the first coil COILU of the first phase (for example, U phase) of the three-phase motor MT, the second terminal of the second coil COILV of the second phase (for example, V phase) of the three-phase motor MT, and the second terminal of the third coil COILW of the third phase (for example, W phase) of the three-phase motor MT as the first voltage signal, such as but not limited to the first voltage signal SSW of the third coil COILW of the third phase (for example, W phase) of the motor MT as shown in FIG. 5.

When the motor signal detection circuit MDE starts to detect the first voltage signal SSW, the positive hysteresis elimination comparison circuit SYCM outputs a positive hysteresis elimination signal to the first control terminal of the comparator CMP. When the first control terminal of the comparator CMP receives the positive hysteresis elimination signal from the hysteresis switching circuit HYS through the first switching element SW11, the comparator CMP compares the voltage of the first voltage signal SSW with the voltage of the second voltage signal SCOM without delaying a positive hysteresis time (HYS+=0).

The motor signal detection circuit MDE outputs a motor output detection signal to the second control terminal of the comparator CMP according to the detected first voltage signal SSW to control the comparator CMP to compare the voltage of the first voltage signal SSW with the voltage of the second voltage signal SCOM without delaying a positive hysteresis time (HYS+=0).

When the duty cycle of the first voltage signal SSW detected by the motor signal detection circuit MDE is greater than a duty cycle threshold, the time point at which the comparator CMP compares the voltage of the first voltage signal SSW and the voltage of the second voltage signal SCOM is between a rising edge time point of a waveform of the first voltage signal SSW and a falling edge time point of the waveform, for example, an intermediate time point between a rising edge time point and a falling edge time point of the same waveform among a plurality of waveforms of the first voltage signal SSW.

On the contrary, when the duty cycle of the first voltage signal SSW detected by the motor signal detection circuit MDE is not greater than a duty cycle threshold, the time point at which the comparator CMP compares the voltage of the first voltage signal SSW and the voltage of the second voltage signal SCOM is between a falling edge time point of a waveform of the first voltage signal SSW and a rising edge time point of the next waveform, for example, an intermediate time point between a falling edge time point of one of the plurality of waveforms of the first voltage signal SSW and a rising edge time point of the next waveform.

Figure 6:
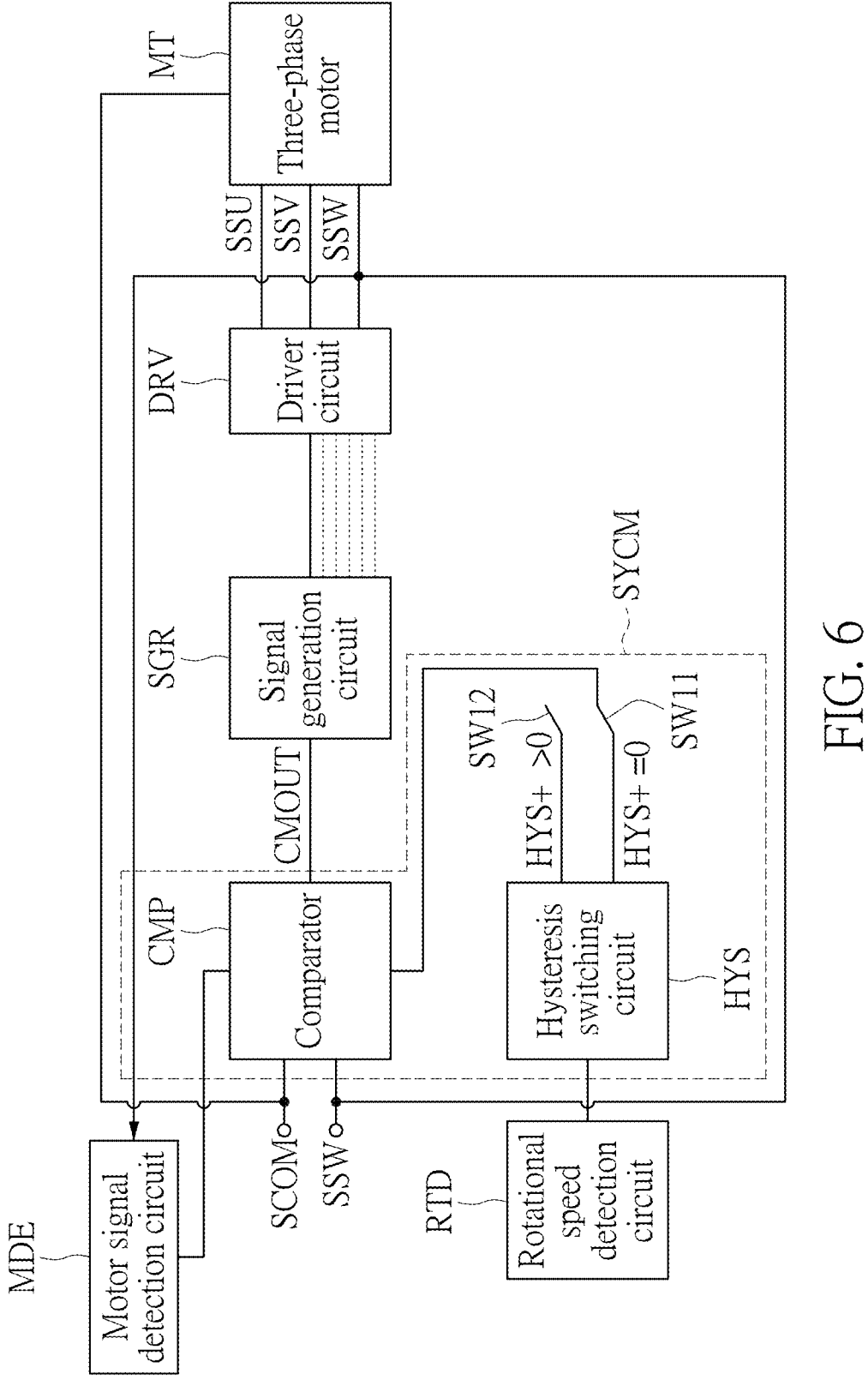
FIG. 6 is a block diagram of a motor driver having a positive hysteresis elimination comparison circuit according to a fifth embodiment of the present disclosure.

Reference is made to FIG. 6. FIG. 6 is a block diagram of a motor driver having a positive hysteresis elimination comparison circuit according to a fifth embodiment of the present disclosure.

The motor driver of the present disclosure not only includes a positive hysteresis elimination comparison circuit SYCM, a signal generation circuit SGR, a driver circuit DRV and a rotational speed detection circuit RTD, but also includes a motor signal detection circuit MDE and a motor signal detection circuit MDE.

The motor signal detection circuit MDE is configured to detect the rotational speed of the three-phase motor MT, and is used to control the time for the comparator CMP of the positive hysteresis elimination comparison circuit SYCM to execute positive hysteresis, and the time to eliminate/cancel the execution of positive hysteresis.

The motor signal detection circuit MDE is configured to control the time point at which negative hysteresis is executed, the time point at which positive hysteresis is executed, and the time point at which the comparator CMP compares the voltage of the first voltage signal SSW with the voltage of the second voltage signal SCOM.

The fifth embodiment of the present disclosure includes content that is similar to part of the third and fourth embodiments of the present disclosure as described above, and such content will not be repeated herein.

Figure 7:
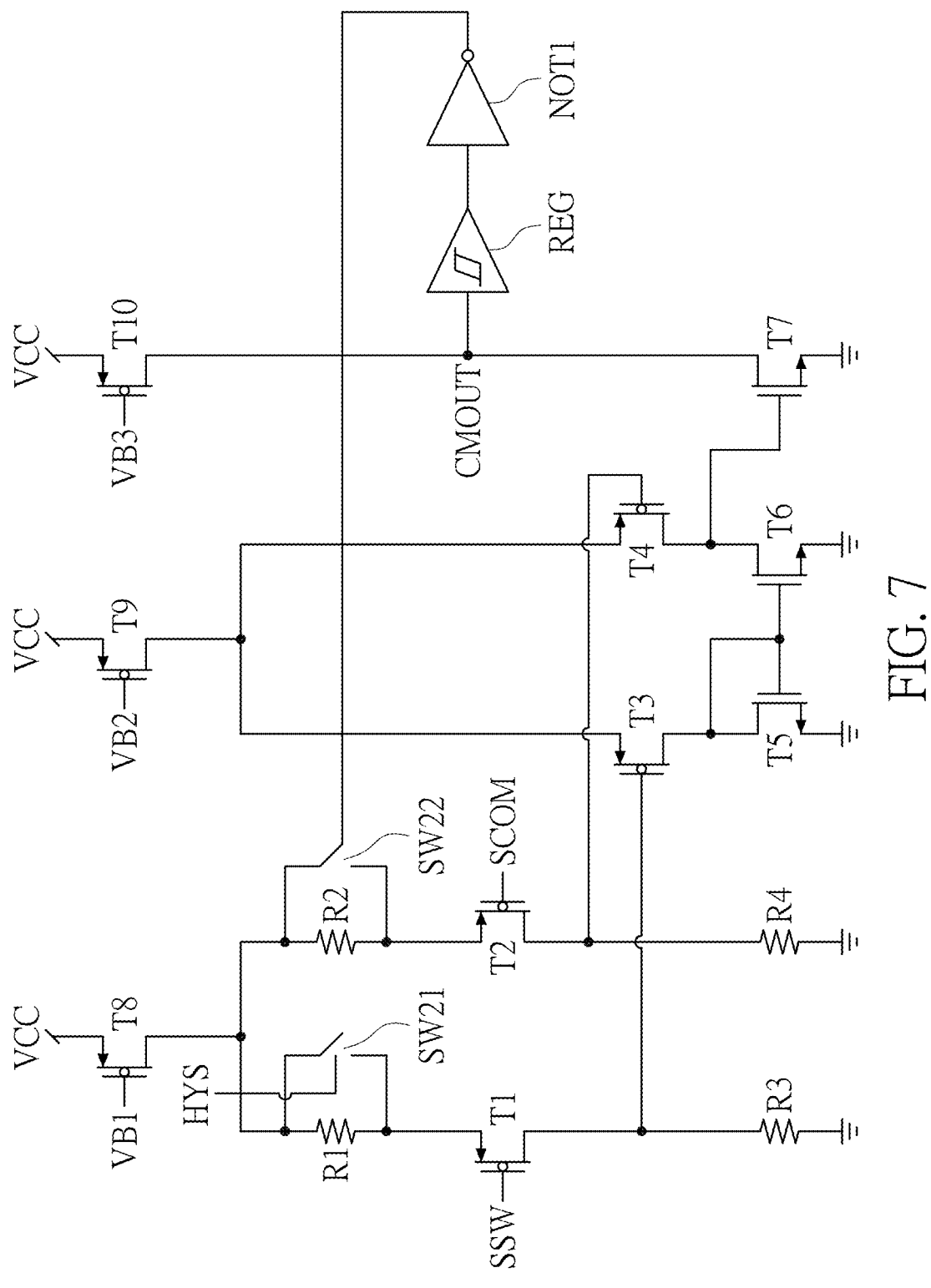
FIG. 7 is a circuit diagram of a comparison circuit inside a comparator of a motor driver having a positive hysteresis elimination comparison circuit according to a sixth embodiment of the present disclosure.

Reference is made to FIG. 7. FIG. 7 is a circuit diagram of a comparison circuit inside a comparator of a motor driver having a positive hysteresis elimination comparison circuit according to a sixth embodiment of the present disclosure.

A comparison circuit in the comparator CMP of the motor driver of the present disclosure as shown in FIGS. 1, 2, 4 to 6 may include one or more of the following circuit elements: a first resistor R1, a first switching element SW21, a first transistor T1, a second transistor T2, a third transistor T3, a fourth transistor T4, a fifth transistor T5, a sixth transistor T6, a seventh transistor T7, a second resistor R2, a second switching element SW22, a regulator REG, an inverter NOT1, an eighth transistor T8, a ninth transistor T9, a tenth transistor T10, a third resistor R3 and a fourth resistor R4, but the present disclosure is not limited thereto. In practice, a comparison circuit in the comparator CMP may appropriately omit one or more circuit components as shown in FIG. 7.

As shown in FIG. 7, the first terminal of the eighth transistor T8 is coupled to the common voltage VCC. The control terminal of the eighth transistor T8 is coupled to the first control voltage VB1. The second terminal of the eighth transistor T8 is connected to the first terminal of the first resistor R1, the first terminal of the first switching element SW21, the first terminal of the second resistor R2 and the first terminal of the second switching element SW22.

The first terminal of the first transistor T1 is connected to the second terminal of the first resistor R1 and the second terminal of the first switching element SW21. The control terminal of the first transistor T1 serves as the first input terminal of the comparator CMP, and is used to receive the signal from one of the second terminal of the first coil COILU of the first phase (for example, U phase) of the three-phase motor MT, the second terminal of the second coil COILV of the two phases (for example, V phase) and the second terminal of the third coil COILW of the third phase (for example, W phase) of the three-phase motor MT as the first voltage signal SSW.

The second terminal of the first transistor T1 is connected to the first terminal of the third resistor R3. The second terminal of the third resistor R3 is grounded.

The first terminal of the second transistor T2 is connected to the second terminal of the second resistor R2 and the second terminal of the second switching element SW22.

The control terminal of the second transistor T2 serves as the second input terminal of the comparator CMP and is used to receive the signal of the common contact point COM from one of the first terminal of the first coil COILU of the first phase (for example, U phase) of the three-phase motor MT, the first terminal of the second coil COILV of the two phases (for example, V phase) of the three-phase motor MT and the first terminal of the third coil COILW of the third phase (for example, W phase) of the three-phase motor MT as the second voltage signal SCOM.

The second terminal of the second transistor T2 is connected to the first terminal of the fourth resistor R4. The second terminal of the fourth resistor R4 is grounded.

The first terminal of the ninth transistor T9 is coupled to the common voltage VCC. The control terminal of the ninth transistor T9 is coupled to the second control voltage VB2. The second terminal of the ninth transistor T9 is connected to the first terminal of the third transistor T3 and the first terminal of the fourth transistor T4.

The control terminal of the third transistor T3 is connected to the second terminal of the first transistor T1.

The control terminal of the fourth transistor T4 is connected to the second terminal of the second transistor T2.

The first terminal of the fifth transistor T5 is connected to the second terminal of the third transistor T3 and the control terminal of the fifth transistor T5. The second terminal of the fifth transistor T5 is grounded.

The first terminal of the sixth transistor T6 is connected to the second terminal of the fourth transistor T4. The control terminal of the sixth transistor T6 is connected to the control terminal of the fifth transistor T5. The second terminal of the sixth transistor T6 is grounded.

The control terminal of the seventh transistor T7 is connected to the first terminal of the sixth transistor T6. The second terminal of the seventh transistor T7 is grounded.

The first terminal of the tenth transistor T10 is coupled to the common voltage VCC. The control terminal of the tenth transistor T10 is coupled to the third control voltage VB3. The second terminal of the tenth transistor T10 is connected to the first terminal of the seventh transistor T7.

The first terminal of the seventh transistor T7 serves as the output terminal of the comparator CMP and is connected to the input terminal of the signal generation circuit SGR.

The input terminal of the regulator REG is connected to the first terminal of the seventh transistor T7.

The input terminal of the inverter NOT1 is connected to the output terminal of the regulator REG. The output terminal of the inverter NOT1 is connected to the control terminal of the second switching element SW22.

The voltage signal at the first terminal of the seventh transistor T7 is used as a comparison signal CMOUT output by the output terminal of the comparator CMP, and is adjusted by the regulator REG, and then is inverted by the inverter NOT1, and is output to the control terminal of the second switching element SW22. When the inverter NOT1 outputs a reset signal (high-level) to the control terminal of the second switching element SW22, the comparator CMP is reset.

In practice, the present disclosure is not limited to the configuration of the first switching element SW21 and the second switching element SW22 as shown in FIG. 7. In practice, the configurations of the two can be reversed.

The control terminal of the first switching element SW21 as shown in FIG. 7 is connected to the output terminal of the hysteresis switching circuit HYS as shown in FIGS. 1, 2 and 4 to 6.

It is worth noting that when the voltage of the first voltage signal SSW is lower than the voltage of the second voltage signal SCOM and the hysteresis switching circuit HYS outputs a positive hysteresis trigger signal (a low-level signal) to the first switching element SW21 to turn off the first switching element SW21, the comparison time of the comparison circuit in the comparator CMP is delayed through the first resistor R1. That is, the comparison circuit in the comparator CMP performs a positive hysteresis operation.

When the voltage of the first voltage signal SSW is higher than the voltage of the second voltage signal SCOM and the hysteresis switching circuit HYS outputs a positive hysteresis elimination signal (a high-level signal) to the control terminal of the first switching element SW21 to turn on the first switching element SW21, the comparison time of a comparison circuit in the comparator CMP is not delayed through the first resistor R1. That is, the comparison circuit in the comparator CMP does not perform positive hysteresis operation.

In summary, the present disclosure provides a positive hysteresis elimination comparison circuit and a motor driver having the same. The positive hysteresis elimination comparison circuit of the present disclosure can accurately determine the time point when the voltage of the first voltage signal at the first input terminal of the comparator is equal to the voltage of the second voltage signal of the comparator (that is, the zero-crossing point). When the positive hysteresis elimination comparison circuit of the motor driver is used to drive the motor, the motor can be efficiently driven according to this precise zero-crossing point.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A positive hysteresis elimination comparison circuit, including:

a comparator configured to compare a voltage of a first voltage signal received by a first input terminal of the comparator with a voltage of a second voltage signal received by a second input terminal of the comparator within a comparison time, so as to output a comparison signal; and a hysteresis switching circuit connected to a first control terminal of the comparator and configured to output a positive hysteresis elimination signal to the first control terminal of the comparator;

wherein, when the voltage of the first voltage signal is lower than the voltage of the second voltage signal, the comparison time is delayed by a negative hysteresis time;

wherein, when the voltage of the first voltage signal is higher than the voltage of the second voltage signal and the first control terminal of the comparator receives the positive hysteresis elimination signal from the hysteresis switching circuit, the comparison time is not delayed by a positive hysteresis time.

2. A motor driver having a positive hysteresis elimination comparison circuit, suitable for a three-phase motor, wherein a first terminal of a first coil of the first phase of the three-phase motor, a first terminal of a second coil of a second phase of the three-phase motor, and a first terminal of a third coil of the third phase of the three-phase motor are connected to a common contact point, and the motor driver includes:

a positive hysteresis elimination comparison circuit, including:

a comparator, wherein a first input terminal of the comparator receives a signal from one of a second terminal of the first coil, a second terminal of the second coil and a second terminal of the third coil of the three-phase motor as a first voltage signal, the second input terminal of the comparator receives a signal from the common contact point as a second voltage signal, and the comparator compares a voltage of a first voltage signal with a voltage of a second voltage signal within a comparison time to output a comparison signal; and a hysteresis switching circuit connected to a first control terminal of the comparator and configured to output a positive hysteresis elimination signal to the first control terminal of the comparator;

a signal generation circuit connected to an output terminal of the comparator and configured to output a waveform signal according to the comparison signal received from the output terminal of the comparator; and a driver circuit connected to the signal generation circuit and the second terminal of the first coil, the second terminal of the second coil and the second terminal of the third coil of the three-phase motor, and configured to drive the three-phase motor according to the waveform signal received from the signal generation circuit;

wherein, when a voltage of the first voltage signal is lower than a voltage of the second voltage signal, the comparison time is delayed by a negative hysteresis time;

wherein, when the voltage of the first voltage signal is higher than the voltage of the second voltage signal and the first control terminal of the comparator receives the positive hysteresis elimination signal from the hysteresis switching circuit, the comparison time is not delayed by a positive hysteresis time.

3. The motor driver according to claim 2, wherein the positive hysteresis elimination comparison circuit further includes:

a first switching element, wherein a first terminal of the first switching element is connected to a first output terminal of the hysteresis switching circuit;

wherein, when a second terminal of the first switching element is switched to the first control terminal connected to the comparator, the positive hysteresis elimination signal output by the first output terminal of the hysteresis switching circuit is transmitted to the first control terminal of the comparator through the first switching element.

4. The motor driver according to claim 3, wherein the positive hysteresis elimination comparison circuit further includes:
  a second switching element, wherein a first terminal of the second switching element is connected to the first output terminal of the hysteresis switching circuit;
  wherein, when a second terminal of the second switching element is switched to the first control terminal connected to the comparator, a positive hysteresis trigger signal output by the first output terminal of the hysteresis switching circuit is transmitted to the first control terminal of the comparator through the second switching element;
  wherein, when the first control terminal of the comparator receives the positive hysteresis trigger signal from the hysteresis switching circuit, the comparison time is delayed by the positive hysteresis time.

5. The motor driver according to claim 4, further including: a rotational speed detection circuit provided on the three-phase motor and configured to detect a rotational speed of the three-phase motor and output a motor rotational speed detection signal.

6. The motor driver according to claim 5, wherein the hysteresis switching circuit is connected to the rotational speed detection circuit and configured to determine that when the three-phase motor has not started or is not running stably according to the motor rotational speed detection signal received from the rotational speed detection circuit, the positive hysteresis trigger signal is to be output to the first control terminal of the comparator, so that the comparison time is delayed by the positive hysteresis time.

7. The motor driver according to claim 5, wherein the hysteresis switching circuit is connected to the rotational speed detection circuit and configured to determine that when the three-phase motor is operating stably according to the motor rotational speed detection signal received from the rotational speed detection circuit, the positive hysteresis elimination signal is to be output to the first control terminal of the comparator.

8. The motor driver according to claim 2, further including: a motor signal detection circuit connected to a second control terminal of the comparator and configured to detect the first voltage signal to output the motor output detection signal to the second control terminal of the comparator for controlling the comparison time.

9. The motor driver according to claim 8, wherein, when the motor signal detection circuit starts to detect the first voltage signal, the hysteresis switching circuit outputs the positive hysteresis elimination signal to the first control terminal of the comparator.

10. The motor driver according to claim 8, wherein, when a duty cycle of the first voltage signal detected by the motor signal detection circuit is greater than a duty cycle threshold, the comparison time is between a rising edge time point of a waveform of the first voltage signal and a falling edge time point of the waveform.

11. The motor driver according to claim 8, wherein, when the duty cycle of the first voltage signal detected by the motor signal detection circuit is greater than a duty cycle threshold, the comparison time is an intermediate time point between a rising edge time point of a waveform of the first voltage signal and a falling edge time point of the waveform.

12. The motor driver according to claim 8, wherein, when the duty cycle of the first voltage signal detected by the motor signal detection circuit is not greater than a duty cycle threshold, the comparison time is between a falling edge time point of one waveform of the first voltage signal and a rising edge time point of a next waveform.

13. The motor driver according to claim 8, wherein, when the duty cycle of the first voltage signal detected by the motor signal detection circuit is greater than a duty cycle threshold, the comparison time is an intermediate time point between a falling edge time point of one waveform of the first voltage signal and a rising edge time point of a next waveform.

14. The motor driver according to claim 2, wherein a comparison circuit in the comparator includes:
  a first resistor, wherein a first terminal of the first resistor is coupled to a common voltage;
  a first switching element, wherein a first terminal of the first switching element is coupled to the common voltage, and a control terminal of the first switching element is connected to an output terminal of the hysteresis switching circuit;
  a first transistor, wherein a first terminal of the first transistor is connected to a second terminal of the first resistor and a second terminal of the first switching element, the control terminal of the first transistor receives the first voltage signal, and the second terminal of the first transistor is grounded;
  a second transistor, wherein a first terminal of the second transistor is coupled to the common voltage, a control terminal of the second transistor receives the second voltage signal, and a second terminal of the second transistor is grounded;
  a third transistor, wherein a first terminal of the third transistor is coupled to the common voltage, and a control terminal of the third transistor is connected to the second terminal of the first transistor;
  a fourth transistor, wherein a first terminal of the fourth transistor is coupled to the common voltage, and a control terminal of the fourth transistor is connected to the second terminal of the second transistor;
  a fifth transistor, wherein a first terminal of the fifth transistor is connected to a second terminal of the third transistor and a control terminal of the fifth transistor, and a second terminal of the fifth transistor is grounded;
  a sixth transistor, wherein a first terminal of the sixth transistor is connected to a second terminal of the fourth transistor, a control terminal of the sixth transistor is connected to the control terminal of the fifth transistor, and a second terminal of the sixth transistor is grounded; and
  a seventh transistor, wherein a control terminal of the seventh transistor is connected to the first terminal of the sixth transistor, a second terminal of the seventh transistor is grounded, and a first terminal of the seventh transistor is connected to an input terminal of the signal generation circuit.

15. The motor driver according to claim 14, wherein the comparison circuit in the comparator further includes:
  a second resistor, wherein a first terminal of the second resistor is coupled to the common voltage, and a second terminal of the second resistor is coupled to the first terminal of the second transistor;
  a second switching element, wherein a first terminal of the second switching element is coupled to the common voltage, and a second terminal of the second switching element is connected to the first terminal of the second transistor;

a regulator, wherein an output terminal of the regulator is connected to the first terminal of the seventh transistor; and an inverter, wherein an output terminal of the inverter is connected to the output terminal of the regulator, and the output terminal of the inverter is connected to a control terminal of the second switching element.

16. The motor driver according to claim 15, wherein the comparison circuit in the comparator further includes:

an eighth transistor, wherein a first terminal of the eighth transistor is coupled to the common voltage, a second terminal of the eighth transistor is connected to the first terminal of the first resistor, the first terminal of the first switching element and the first terminal of the second switching element, and a control terminal of the eighth transistor is coupled to a first control voltage; and a ninth transistor, wherein a first terminal of the ninth transistor is coupled to the common voltage, a second terminal of the ninth transistor is connected to the first terminal of the third transistor and the first terminal of the fourth transistor, and a control terminal of the ninth transistor is coupled to a second control voltage.

17. The motor driver according to claim 16, wherein the comparison circuit in the comparator further includes:

a tenth transistor, wherein a first terminal of the tenth transistor is coupled to the common voltage, a second terminal of the tenth transistor is connected to the first terminal of the seventh transistor, and a control terminal of the tenth transistor is coupled to a third control voltage.

18. The motor driver according to claim 17, wherein the comparison circuit in the comparator further includes:

a third resistor, wherein a first terminal of the third resistor is connected to the second terminal of the first transistor, and a second terminal of the third resistor is grounded.

19. The motor driver according to claim 18, wherein the comparison circuit in the comparator further includes:

a fourth resistor, wherein a first terminal of the fourth resistor is connected to the second terminal of the second transistor, and a second terminal of the fourth resistor is grounded.

\* \* \* \* \*